(12) United States Patent
Matsui et al.

(10) Patent No.: US 7,110,056 B2
(45) Date of Patent: Sep. 19, 2006

(54) THIN FILM TRANSISTOR ARRAY SUBSTRATE AND METHOD FOR REPAIRING THE SAME

(75) Inventors: Akihiro Matsui, Kawasaki (JP); Tetsuya Fujikawa, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/811,769

(22) Filed: Mar. 29, 2004

(65) Prior Publication Data

US 2004/0222419 A1 Nov. 11, 2004

(30) Foreign Application Priority Data

Mar. 31, 2003 (JP) ............................. 2003-097104
Mar. 9, 2004 (JP) ............................. 2004-066096

(51) Int. Cl.
*G02F 1/1343* (2006.01)

(52) U.S. Cl. ............................. 349/38; 349/39; 349/41; 349/43

(58) Field of Classification Search ........ 438/149–166, 438/424–432, 479–490
See application file for complete search history.

(56) References Cited

U.S. PATENT DOCUMENTS

| 5,132,819 | A | 7/1992 | Noriyama et al. |
| 6,495,386 | B1 * | 12/2002 | Powell ........................ 438/48 |
| 6,642,086 | B1 * | 11/2003 | Lim et al. ................... 438/149 |
| 6,709,902 | B1 * | 3/2004 | Kitakado et al. ........... 438/149 |

FOREIGN PATENT DOCUMENTS

| JP | 03-212620 | 9/1991 |
| JP | 05-165055 | 6/1993 |
| JP | 10-161156 | 6/1998 |
| JP | 11-007046 | 1/1999 |
| JP | 2002-278476 | 9/2002 |

* cited by examiner

*Primary Examiner*—Wai-Sing Louie
(74) *Attorney, Agent, or Firm*—Greer, Burns & Crain, Ltd.

(57) ABSTRACT

A thin film transistor array substrate includes an insulating substrate; a thin film transistor arranged in a part of a pixel area on the insulating substrate; an auxiliary capacitor having an auxiliary capacitor electrode arranged in the pixel area and an opposite electrode facing the auxiliary capacitor electrode via an insulating layer, the opposite electrode being located in the same layer as source and drain electrodes of the thin film transistor; and a pixel electrode formed in the pixel area. The opposite electrode is divided into two or more sections, and each of the sections is electrically connected to the pixel electrode via a contact hole.

6 Claims, 12 Drawing Sheets

THIN FILM TRANSISTOR ARRAY SUBSTRATE AND METHOD FOR REPAIRING THE SAME

BACKGROUND OF THE INVENTION

1. Field of the Invention

The present invention generally relates to a thin film transistor (TFT) array substrate and a repair method for a TFT array substrate, and more particularly, to an auxiliary capacitor structure of a TFT array substrate used in display apparatuses and a method for repairing point defect produced during the fabrication process of the TFT array substrate.

2. Description of the Related Art

In recent years and continuing, cost reduction and improved image quality are demanded for display units of information technology equipment. Such demand is especially remarkable for liquid crystal displays (LCDs) used in cellular phones, personal digital assistants, notebook PCs, view finders of video cameras, and the like.

In a liquid crystal display, liquid crystal is sandwiched between a TFT array substrate, in which an array of thin film transistors is formed for driving pixels, and an opposite substrate. Displayed images are controlled by regulating orientation of the liquid crystal. It takes several miliseconds until orientation of the liquid crystal is stabilized, and an electric charge supplied by switching of the thin film transistor has to be maintained during this period. For this reason, an auxiliary capacitor is required to achieve high-quality image display.

Because a defect in the auxiliary capacitor leads to a defect of a pixel, it is important to remove deficiencies in auxiliary capacitors, and an improved and reliable structure of auxiliary capacitors is required.

In reality, millions of TFTs are often formed on a substrate, and it is difficult to manufacture a TFT array substrate with substantially no point defects. Accordingly, technology for repairing a point defect detected by inspection during the manufacturing process of the TFT array substrate becomes important.

FIG. 1 is a plan view of a pixel area of a conventional TFT array substrate, FIG. 2A is a cross-sectional view taken along the C–C' line of FIG. 1, and FIG. 2B is a cross-sectional view taken along the D–D' line of FIG. 1. As shown in FIG. 2, a semiconductor film 104 is formed over a gate electrode 101 via a gate insulating layer 103. A region of the semiconductor film 104 that faces the gate electrode 101 functions as a channel region. Over the semiconductor film 104 are formed a source electrode 107 and a drain electrode 106 via an impurity diffusion layer 121. The source electrode 107 and the drain electrode 106 face each other across an etching stopper 105 (See FIG. 1).

On the right-hand side of FIG. 2A, an auxiliary capacitor electrode 102 is formed in the same level as the gate electrode 101. A middle electrode (or an opposite electrode) 109 is positioned over the auxiliary capacitor electrode 102 with the gate insulating layer 103 between them to form an auxiliary capacitor. To be more precise, the middle electrode 109 is formed over the gate insulating layer 103 via the semiconductor film 104 and the impurity diffusion layer 121.

The middle electrode 109 is connected to a pixel electrode 112 through a contact hole 111. The pixel electrode 112 is also connected to the source electrode 107 through another contact hole 111. Accordingly, the source electrode 107 and the middle electrode 109 are electrically connected to each other via the pixel electrode 112 and contact holes 111. With this conventional structure, a conducting pad is required for contact on the source electrode 107, which reduces the aperture ratio.

If, in this TFT array substrate, malfunction or bad electrical contact occurs in a TFT, a voltage is not supplied to the pixel electrode 112, which results in a point defect. To deal with this problem, the point defect is detected by electrically inspecting the capacitance of the auxiliary capacitor during the fabrication process of the TFT array substrate. Upon detection of a point defect, such defect is to be repaired.

Conventionally, extra TFTs and isolated electrodes are provided in advance in the TFT array substrate for repair purposes, expecting occurrence of point defects. If a point defect pixel is detected, that pixel is repaired using the extra TFT and the isolated electrode.

For example, JP 10-161156A discloses a technique for repairing a point defect pixel. With this technique, an isolated electrode is arranged between adjacent pixels, and the pixel electrode of a point defect pixel is connected to that of the adjacent normal pixel via the isolated electrode by laser irradiation.

In general, when a necessary level of voltage is not supplied to a pixel electrode, that pixel becomes a point defect pixel in the normally-black mode. With the technique disclosed in JP 10-161156A, a required potential difference is produced in the point defect pixel by connecting the pixel electrode of the point defect pixel to that of the adjacent normal pixel.

Another technique is disclosed in JP 2002-278476A, which technique does not require extra TFTs or isolated electrodes. With this technique, the malfunctioning transistor (TFT) of the point defect pixel is cut off from the pixel electrode by a laser, and the separated pixel electrode is connected to that of a normally operating adjacent pixel by a metal film formed by laser CVD such that electric connection is obtained. This repair method makes use of the regularity in arrangement of the pixel array.

However, with the conventional repair methods, a voltage sufficient to support two pixels has to be guaranteed in spite of the fact that the voltage and the auxiliary capacitance supplied from the normally operating TFT are for a single pixel. To this end, driving means and driving voltages have to be determined predicting necessity of repair. This leads to increase of power consumption.

Concerning the image quality, the above-described conventional repair methods are acceptable as long as the repaired (or connected) two adjacent pixels belong to an area to be displayed with the same tone. However, if the boundary or the outline of a pattern extends between the repaired two adjacent pixels, and if these two pixels are to be displayed with different tones, then one of the pixels will be recognized as a dark spot or a bright spot.

Along with the structural problem, that is, the reduced aperture ratio, of the conventional TFT array substrate, the problems in the conventional repair methods degrade the image quality of a liquid crystal panel.

SUMMARY OF THE INVENTION

Therefore, it is an object of the present invention to provide a TFT array substrate with an improved auxiliary capacitor structure that can maintain the aperture ratio high while achieving reliability in inspection for point defects.

It is another object of the present invention to provide a method for repairing a point defect pixel in a TFT array substrate, which can prevent degradation of the image quality even after the repair, without causing power consumption to increase.

To achieve the first object, the middle electrode (i.e., the opposite electrode) that defines the auxiliary capacitor is divided into a plurality of sections, and one of the sections is connected directly to the source electrode of the thin film transistor (TFT). Each of the divided sections of the middle electrode (or the opposite electrode) is connected to the pixel electrode via a contact hole.

To achieve the second object, the pixel electrode of a point defect pixel is cut into two portions at a location corresponding to the domain boundary of the orientation of liquid crystal. One of the portions is connected to the pixel electrode of one of normally operating adjacent pixels located on both sides of the point defect pixels, and the other portion is connected to the pixel electrode of the other of the normally operating adjacent pixels, to make the potential level of the point defect pixel equal to that of the adjacent pixels.

In one aspect of the invention, a thin film transistor array substrate comprises an insulating substrate; a thin film transistor arranged in a part of a pixel area on the insulating substrate; an auxiliary capacitor having an auxiliary capacitor electrode arranged in the pixel area and an opposite electrode facing the auxiliary capacitor electrode via an insulating layer, the opposite electrode being located in the same layer as source and drain electrodes of the thin film transistor; and a pixel electrode formed in the pixel area, wherein the opposite electrode is divided into two or more sections, and each of the sections is electrically connected to the pixel electrode via a contact hole.

In another aspect of the invention, a thin film transistor array substrate comprises an insulating substrate; a thin film transistor arranged in a part of a pixel area on the insulating substrate; an auxiliary capacitor having an auxiliary capacitor electrode arranged in the pixel area and an opposite electrode facing the auxiliary capacitor electrode via an insulating layer, the opposite electrode being located in the same layer as source and drain electrodes of the thin film transistor; a connection located in the same layer as the source electrode and the opposite electrode and extending between the source electrode and the opposite electrode; and a pixel electrode formed in the pixel area, wherein the opposite electrode is electrically connected to the pixel electrode via a contact hole.

In still another aspect of the invention, a method for repairing a thin film transistor array substrate comprises the steps of:
(a) forming a plurality of pixels on an insulating substrate, each pixel having a thin film transistor and a pixel electrode electrically connected to the thin film transistor;
(b) detecting a point defect pixel among the pixels;
(c) separating the pixel electrode from the thin film transistor in the point defect pixel;
(d) cutting the separated pixel electrode into two areas; and
(e) coupling one of the two areas of the cut pixel electrode to a pixel electrode of an adjacent normal pixel, and coupling the other area to the cut pixel electrode to a pixel electrode of another adjacent normal pixel.

BRIEF DESCRIPTION OF THE DRAWINGS

Other objects, features, and advantages of the present invention will become more apparent from the following detailed description when read in conjunction with the accompanying drawings, in which.

DESCRIPTION OF THE PREFERRED EMBODIMENTS

The preferred embodiments of the invention are now described with reference to the accompanying drawings.

Figure 1:
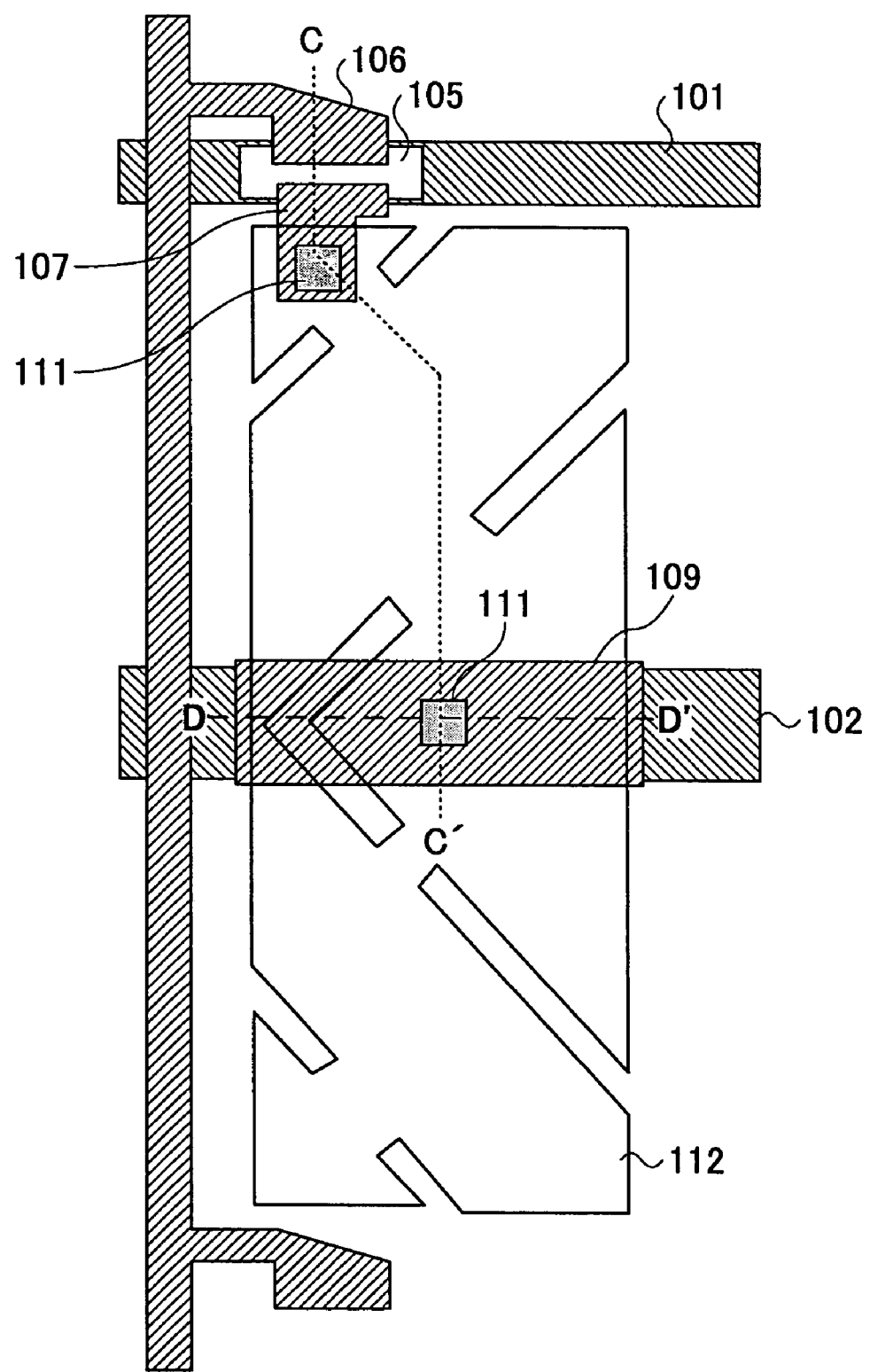
FIG. 1 is a plan view of a pixel area of a conventional TFT array substrate.
Figures 2A, 2B:
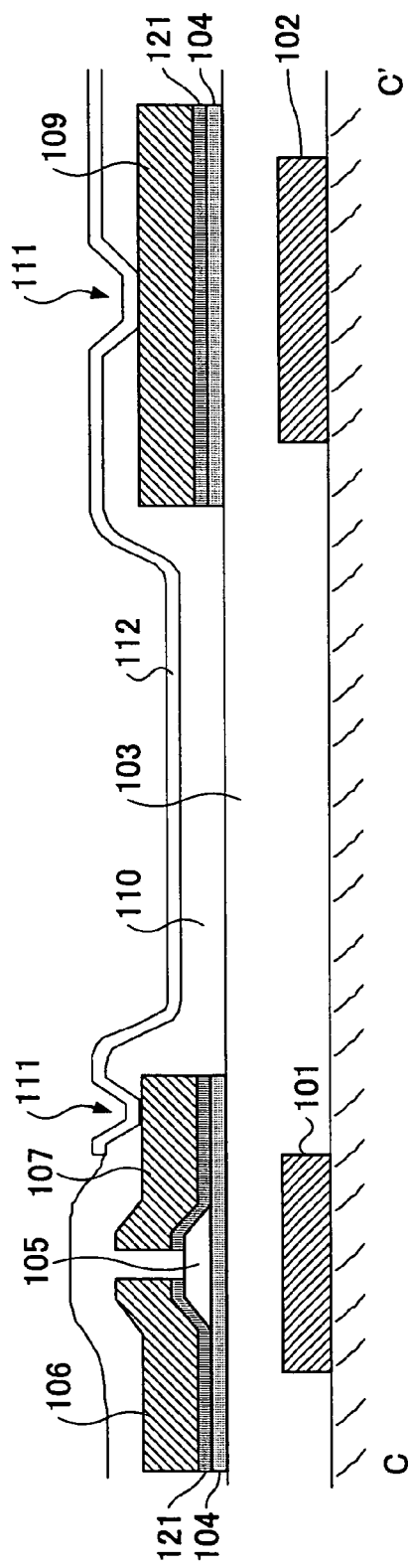
FIG. 2A and FIG. 2B are cross-sectional views of the conventional TFT array substrate shown in FIG. 1.
Figure 3:
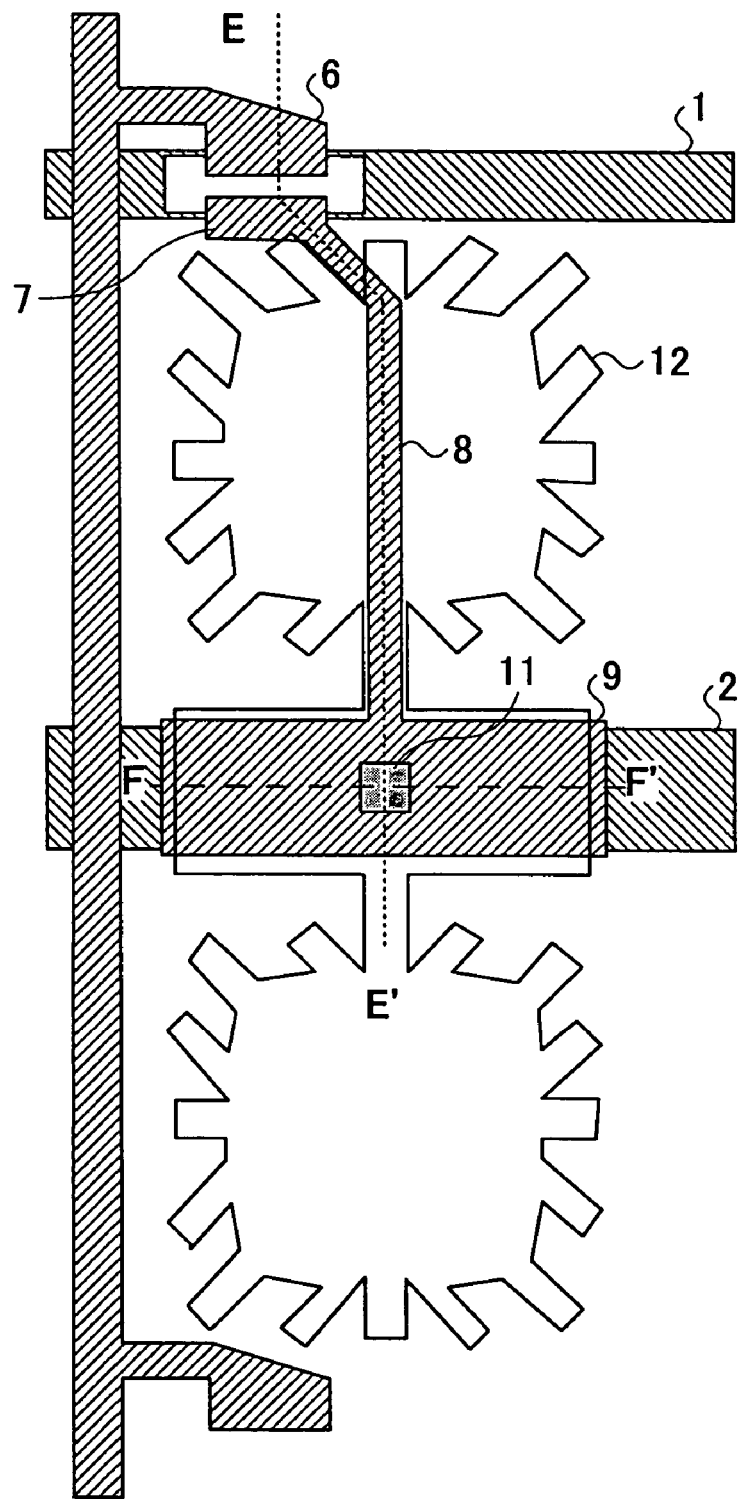
FIG. 3 is a plan view of a pixel area of a TFT array substrate according to an embodiment of the invention, which is proposed in the process of reaching the TFT array substrate shown in FIG. 5.
Figure 4A:
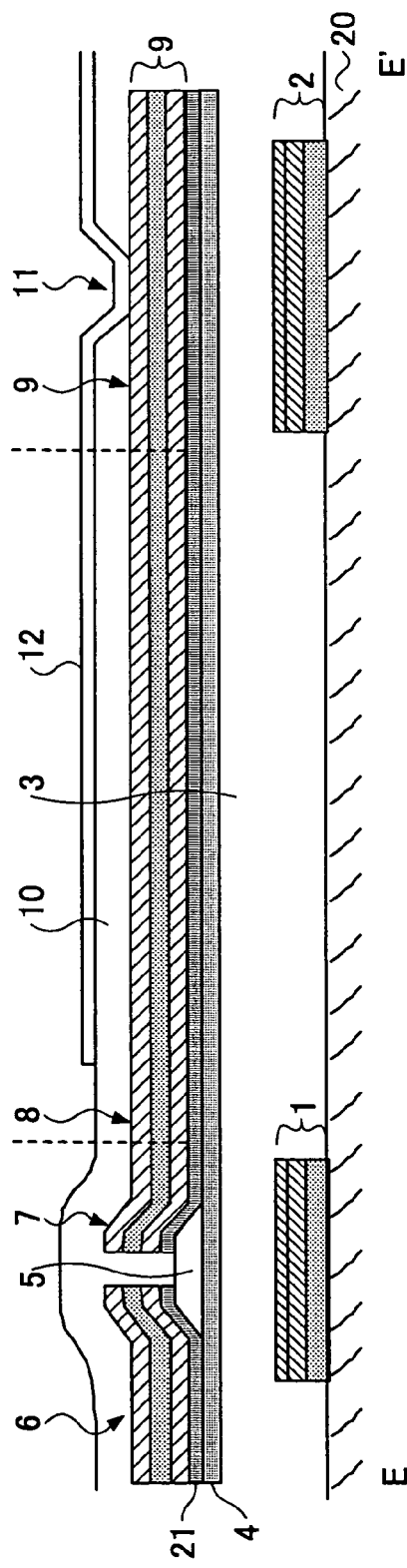
FIG. 4A and FIG. 4B are cross-sectional views of the TFT array substrate shown in FIG. 3.
Figure 4B:
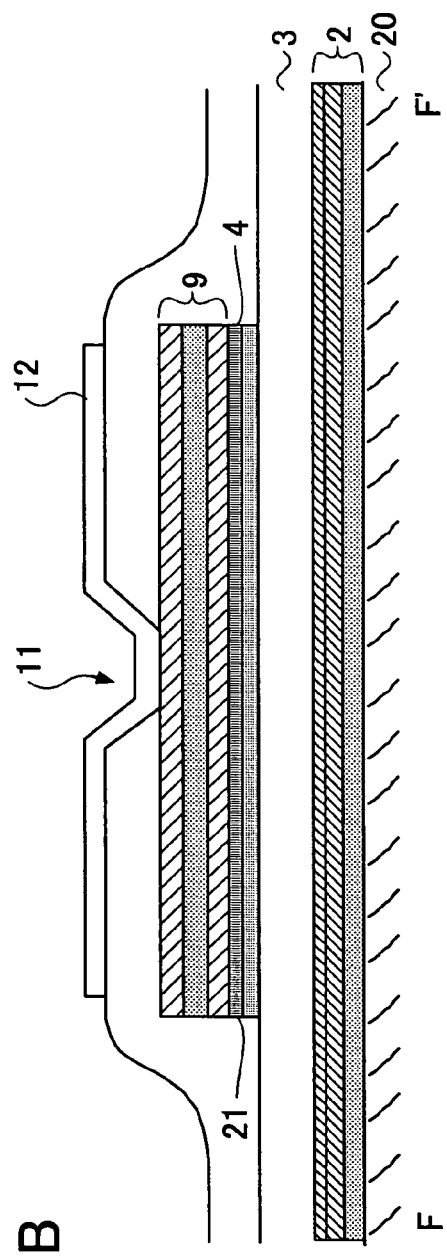

FIG. 3 and FIG. 4 illustrate a TFT array substrate according to an embodiment of the invention. FIG. 4A is a cross-sectional view taken along the E–E' line shown in FIG. 3, and FIG. 4B is a cross-sectional view taken along the F–F" line. The TFT array substrate shown in FIG. 3 and FIG. 4 is conceived and proposed in an attempt to solve the problem of the reduced aperture ratio of the conventional TFT array substrates, in the process of achieving the TFT array substrate shown in FIG. 5 and FIG. 6.

To maintain the aperture ratio high, the source electrode 7 and the middle electrode (or the opposite electrode) 9 facing the auxiliary capacitor electrode 2 are connected by a connection 8, which is formed in the same layer as the source electrode 7 and the middle electrode 9. The source electrode 7 is connected directly to the middle electrode 9 without relying on the pixel electrode 12. The middle electrode 9 is connected to the pixel electrode 12 through a contact hole 11. Accordingly, when a voltage is applied to the gate electrode 1, electric charges are supplied to the pixel electrode 12 from the source electrode 7 via the connection 8 and the contact hole 11. With this structure, only a single contact hole 11 is required per pixel.

It may appear that the metal layer that forms the connection 8 and extends across the pixel electrode 12 reduces the aperture ratio of the liquid crystal panel. However, with the configuration of the pixel electrode 12 with branches extending to the right and the left as illustrated in FIG. 3, the liquid crystal is orientated in either direction in accordance with the direction in which the branches extend. The optical permeability is low at the boundary (along the center line of the pixel in this example) between the liquid crystal domains with opposite orientations. Since the connection 8 runs along the domain boundary, the presence of connection 8 does not affect the optical permeability as a whole.

This arrangement can eliminate the contact-hole pad provided on the source electrode in the conventional technique, and prevent the reduction of the aperture ratio. However, another problem arises with this structure. Although a point defect due to malfunction of the TFT is correctly detected by electrically inspecting the auxiliary capacitance, a point defect due to a defect of the contact hole 11 cannot be detected by the electric inspection.

This is because the auxiliary capacitance is properly formed in spite of the fact that the voltage is not applied to the pixel electrode 12 due to the failure of the contact hole 11. Because of the presence of the auxiliary capacitance, this pixel would pass the electric inspection, and the point defect may be overlooked. As a result, satisfactorily high image quality may not be achieved.

Of course, the pixel structure show in FIG. 3 and FIG. 4 is superior as long as the point defect due to bad electric contact of the contact hole 11 is detected by another inspecting method. The advantage of eliminating the contact-hole pad from the source electrode 7 and improving the aperture ratio is achieved.

Figure 5:
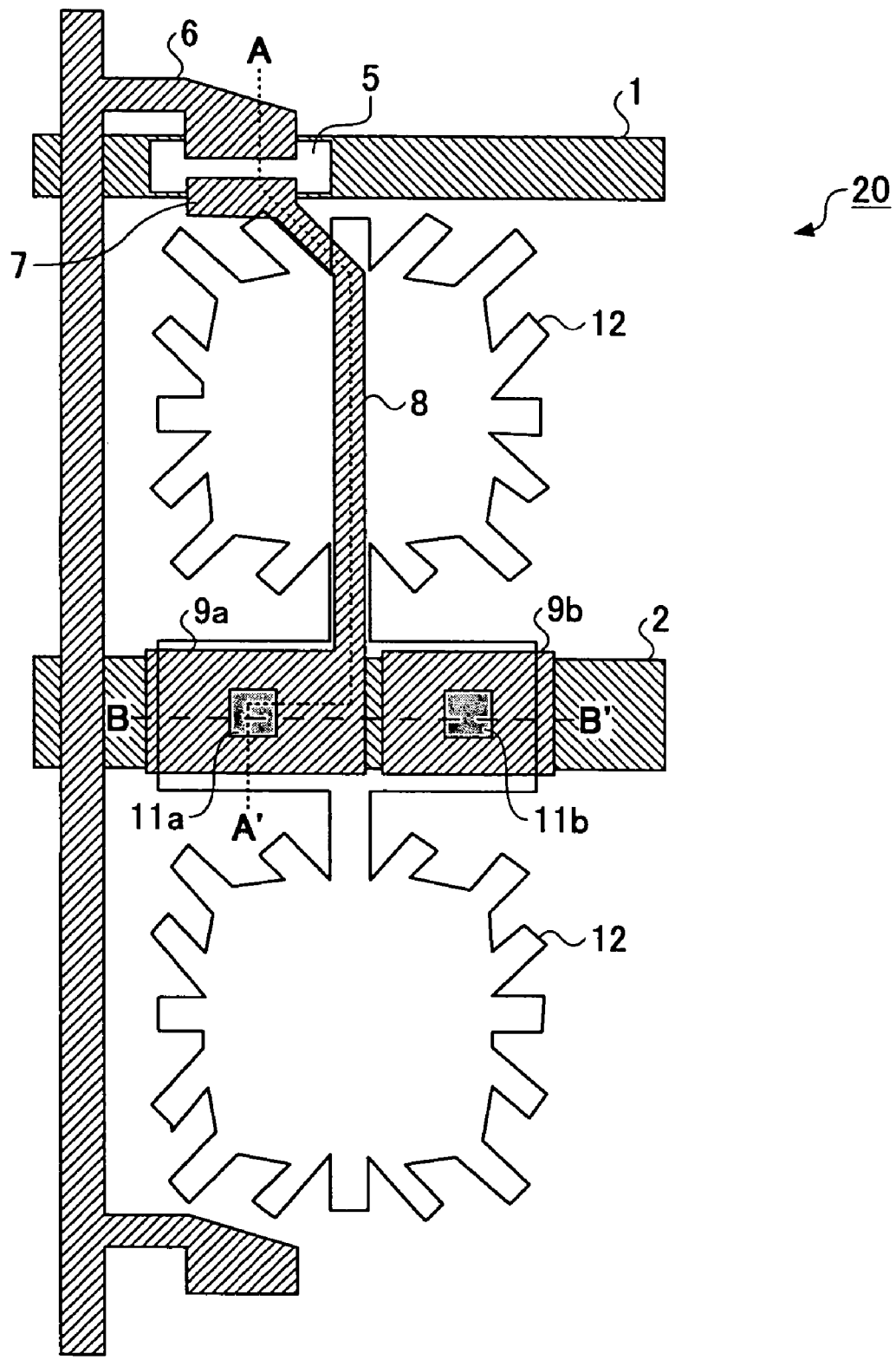
FIG. 5 is a plan view a pixel area of the TFT array substrate according to another embodiment of the present invention.
Figure 6A:
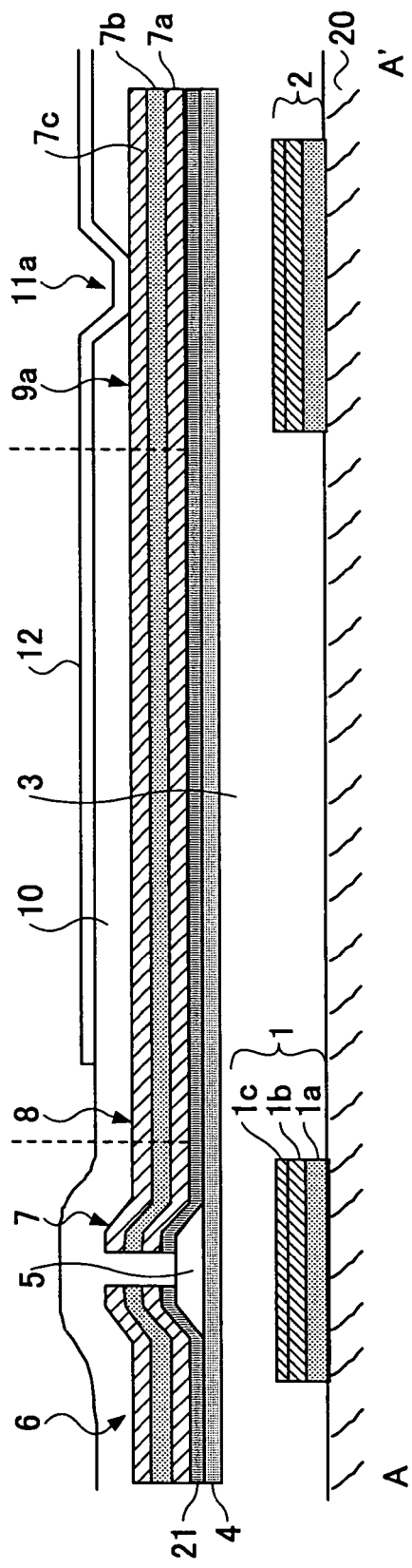
FIG. 6A and FIG. 6B are cross-section views of the TFT array substrate shown in FIG. 5.
Figure 6B:
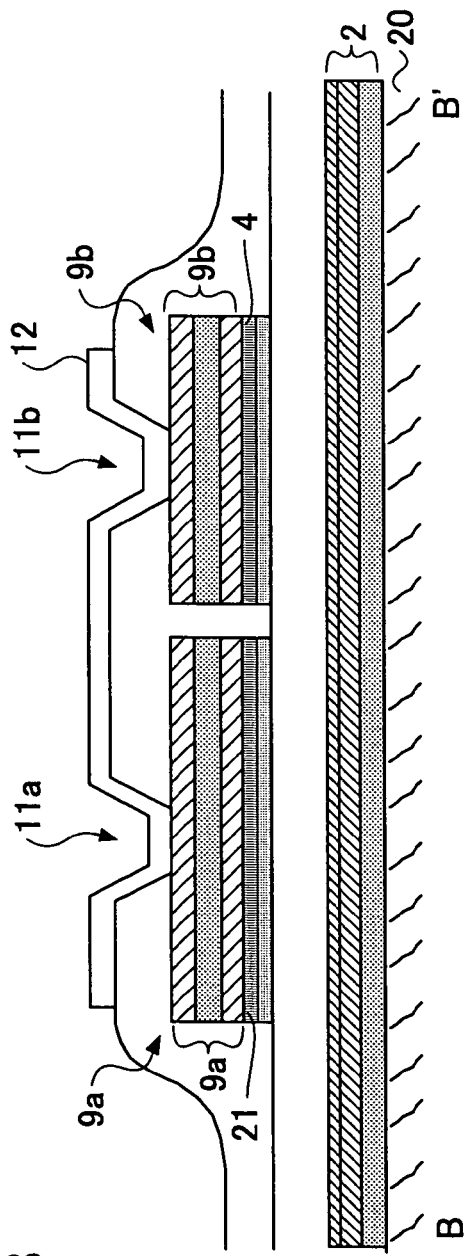

FIG. 5 and FIG. 6 illustrate a TFT array substrate according to another embodiment of the invention, which is a further improvement of the TFT array substrate shown in FIG. 3 and FIG. 4. FIG. 6A is a cross-sectional view taken along the A–A' line shown in FIG. 5, and FIG. 6B is a cross-sectional view taken along the B–B' line shown in FIG. 5.

This TFT array substrate can eliminate the contact-hole pad from the source electrode 7, and at the same time, reliable electric inspection based on the auxiliary capacitance is achieved.

As illustrated in FIG. 5 and FIG. 6A, a gate electrode 1 and the auxiliary capacitor electrode 2 are arranged on the substrate 20. The gate electrode 1 and the auxiliary capacitor electrode 2 are formed at the same time in the same layer in the same process. The gate electrode 1 and the auxiliary capacitor electrode 2 employ a three-layer structure consisting of an aluminum (Al) layer, a molybdenum nitride (MoN) layer, and a molybdenum (Mo) layer, successively deposited in this order on the substrate 20. The three layers are collectively called the first conductive film.

A semiconductor layer 4 is formed over the gate electrode 1 and the auxiliary capacitor electrode 2 via a gate insulating layer 3. A part of the semiconductor layer 4 that faces the gate electrode 1 constitutes a channel region. On the semiconductor layer 4 is formed an n+ type semiconductor layer 21, which functions as a source/drain impurity diffusing region. An etching stopper 5 is formed on the n+ type semiconductor layer 21, and a source electrode 7 and a drain electrode 6 are formed on the corresponding sides of the etching stopper 5 so as to overlap the gate electrode 1. In the embodiment, the source electrode 7 and the drain electrode 6 employ a three-layer structure consisting of a titanium (Ti) layer 7a, an aluminum (Al) layer 7b, and another titanium (Ti) layer 7c successively deposited on the n+ type semiconductor layer 21 in this order. The three layers are collectively called the second conductive film.

As illustrated in FIG. 5, FIG. 6A and FIG. 6B, a pair of middle electrodes 9a and 9b are provided over the auxiliary capacitor electrode 2 via the gate insulating layer 3. The first middle electrode 9a is formed in the same layer using the same material as the source electrode 7 of the TFT section, and is connected to the source electrode 7 by the connection 8 extending along the domain boundary of liquid crystal orientation. The second middle electrode 9b is also arranged over the auxiliary capacity electrode 2 via the gate insulator layer 3, but is separated from the source electrode 7.

The source electrode 7, the drain electrode 6, the connection 8, and the middle electrode pair 9a and 9b are covered with a protective layer 10. A pixel electrode 12 is arranged on the protective layer 10. The pixel electrode 12 is patterned into a shape having branches spreading to the left and right, which determines the orientation of the liquid crystal. Upon application of a voltage, the liquid crystal (not shown) is orientated in the direction in which the branched electrode extends, and the liquid crystal is divided into two domains with orientations opposite to each other. A connection 8 extends along the boundary between the two liquid crystal domains, which extends along the center of the pixel in this example.

The first middle electrode 9a and the second middle electrode 9b are electrically connected to the pixel electrode 12 via contact holes 11a and 11b, respectively. On the other hand, the source electrode 7 does not have a contact that is coupled directly to the pixel electrode 12. Accordingly, the configuration shown in FIG. 5 and FIG. 6 can eliminate a contact-hole pad on the source electrode 7, as in the structure shown in FIG. 3 and FIG. 4.

Since the middle electrode 9 is divided into two or more sections (two in this example), a point defect is correctly detected when the defect occurs in the TFT or either of the contact holes 11a and 11b, based on electric inspection measuring a change in auxiliary capacitance.

For instance, if the contact hole 11a has bad electric contact, the voltage is not supplied to the pixel electrode 12, and no electric charge is provided to the second middle electrode 9b. In this case, the auxiliary capacitance between the second middle electrode 9b and the auxiliary capacity electrode 2 decreases. By monitoring a change in this auxiliary capacitance, a point defect can be detected.

Next, a process for fabricating the TFT array substrate shown in FIG. 5 and FIG. 6 is explained although the detailed steps are not illustrated by drawings.

(1) First, the first conductive film is formed over the substrate 20. The first conductive film is delineated into a predetermined pattern using a resist mask, and the gate electrode 1 and the auxiliary capacitor electrode 2 are formed. In this embodiment, the first conductive film consists of three layers, namely, an Al layer, a MoN layer and a Mo layer, which are deposited successively in this order by, for example, sputtering. (The present invention is not limited to this example.) A resist is formed over the top layer (i.e., the Mo layer), and the first conductive film is patterned by photolithography and etching processes.

(2) Then, a gate insulating layer 3, a semiconductor layer 4, and an etching stopper layer 5 are successively formed over the substrate 20, and the etching stopper layer 5 is patterned such that an island remains on the channel region of the semiconductor layer 4.

(3) Then, an n+ type semiconductor layer 21 and the second conductive film are formed over the substrate 20. In this embodiment, the second conductive film consists of a Ti layer 7a, an Al layer 7b and anther Ti layer 7c, as has been described above. However, the second conductive film is not limited to this example, and other suitable structures may be employed. The second conductive film, the n+ type semiconductor layer 21, and the semiconductor layer 4 are patterned so as to form the source electrode 7, the drain electrode 6, the connection 8, and the middle electrodes 9a and 9b.

(4) Then, a protective layer 10 is formed of an insulating material, such as silicon nitride (SiN) or silicon oxide (SiO2) deposited by CVD, or alternatively, a resin layer may be used as the protective layer 10. Although not shown in FIG. 6, color filters (CF) may be formed prior to forming the protective layer 10 so as to accomplish a CFonTFT structure.

(5) Then, apertures are formed in the protective layer 10 so as to reach the middle electrodes 9a and 9b. Simultaneously, other apertures for external connection are also formed in the protective layer 10 at terminal positions of the TFT array substrate 20. If a resin material is used as the protective layer 10, or if color filters are used in combination with the protective layer 10, the apertures are formed during the patterning process of such a layer.

(6) Finally, a transparent conductive film is formed over the substrate 20, which is then patterned into a predetermined shape to form the pixel electrode 12, and the TFT array substrate 20 is accomplished.

When using the TFT array substrate in a liquid crystal panel, for example, a vertical alignment film is formed over the TFT array substrate to produce a vertical alignment (VA) type liquid crystal display (LCD).

Figure 7:
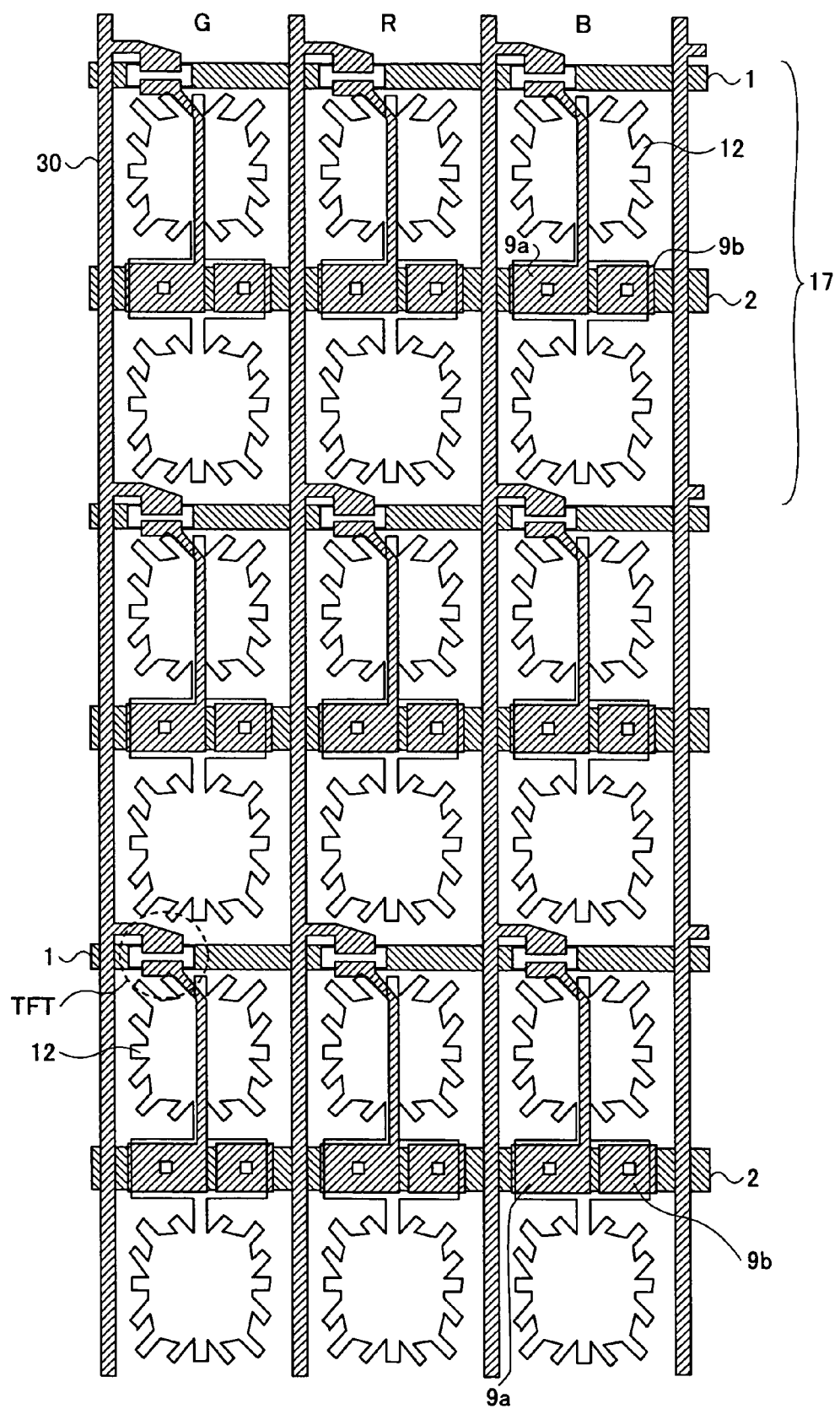
FIG. 7 shows an arrangement of the pixel array on the TFT array substrate according to an embodiment of the present invention.

FIG. 7 shows an example of the pixel array of the TFT array substrate with the above-described auxiliary capacitor structure. In the example of FIG. 7, a pixel 17 is defined by a gate electrode line 1 extending horizontally in the page and a scanning line 30 extending vertically in the page. A number of pixels 17 are arranged in a matrix. Each of the pixels 17 has a pixel electrode 12 with a branched shape, a TFT that switches a voltage to be applied to the pixel electrode 12, and an auxiliary capacitor comprising the auxiliary capacitor electrode 2 and the divided middle electrodes 9a and 9b.

It is desirable that the pixels in the same column be allocated to the same color so as to conform to the point defect repairing technique according to an embodiment of the invention, which is described below. In the example shown in FIG. 7, a green-pixel column labeled G, a red-pixel column labeled R, and a blue-pixel column labeled B are alternately and repeatedly arranged.

Figure 8:
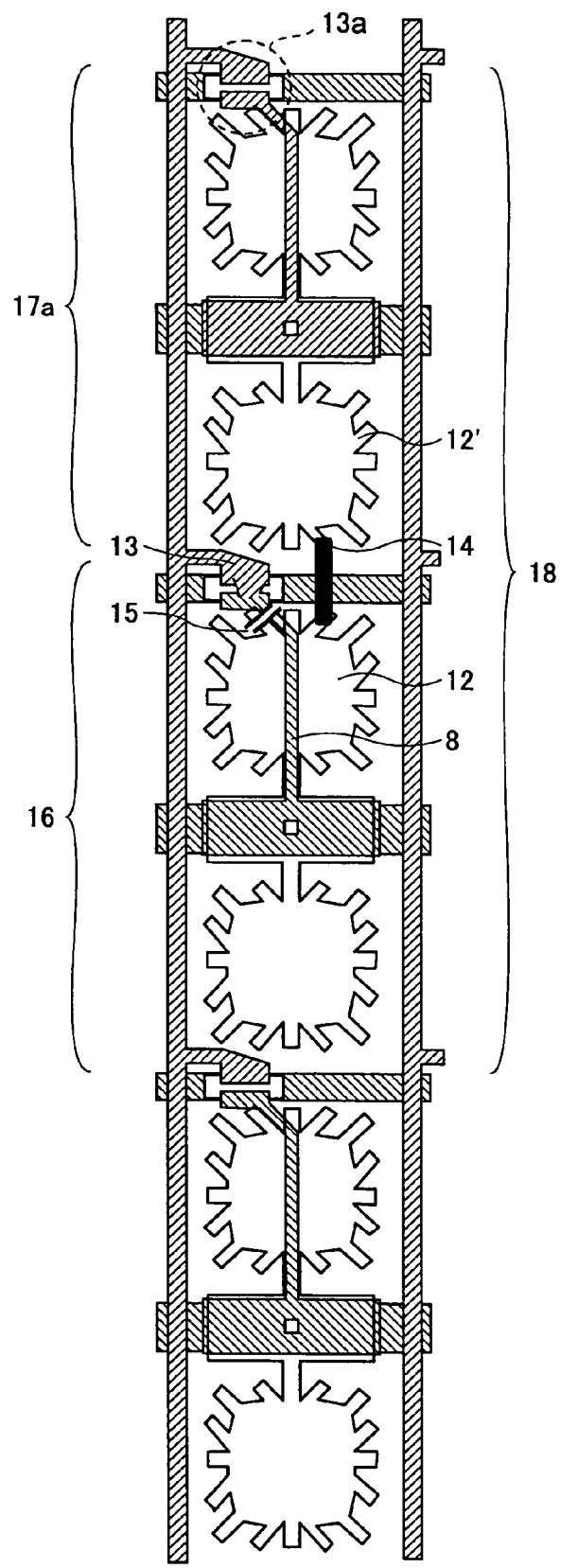
FIG. 8 shows a portion of the pixel array for explaining the conventional repair method.
Figure 9:
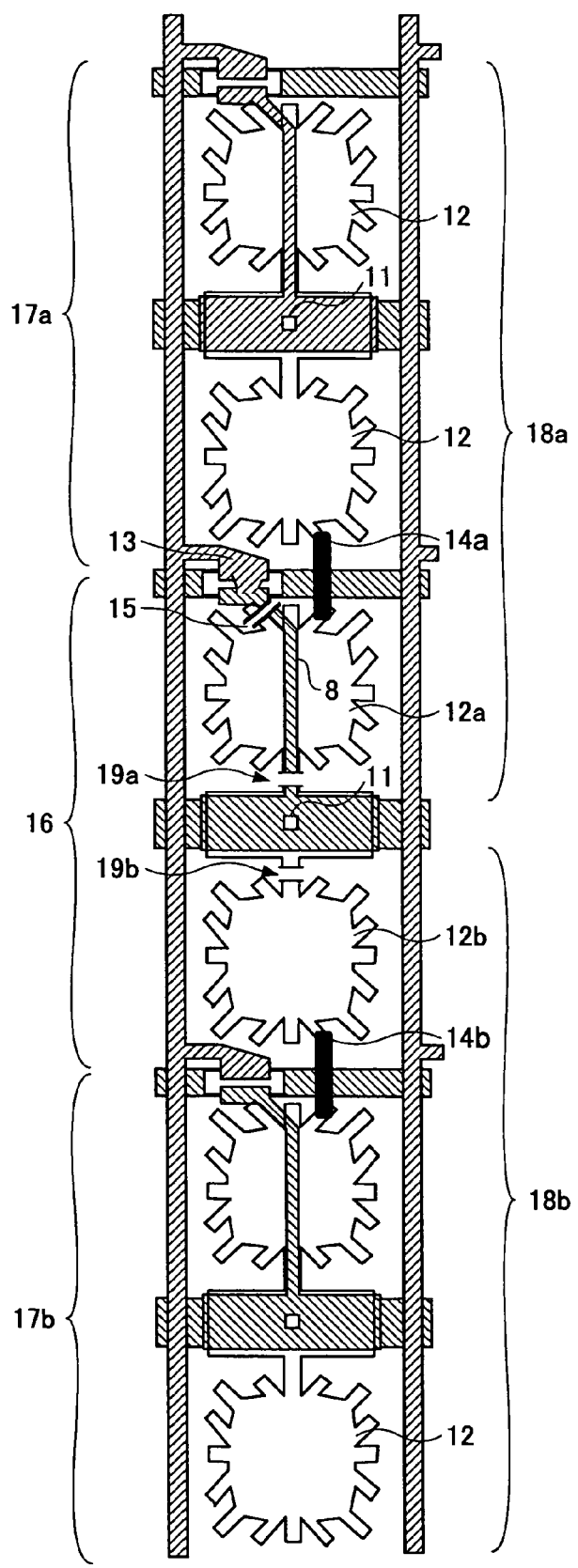
FIG. 9 shows a portion of the pixel array for explaining the repair method according to an embodiment of the present invention.

FIG. 9 is a diagram for explaining the method for repairing a point defect pixel during the fabrication process of the TFT array substrate according to an embodiment of the invention. For comparison purposes, a conventional repairing method applied to the TFT array substrate shown in FIG. 3 is also explained with reference to FIG. 8.

It is assumed that a point defect pixel due to malfunction of a TFT 13 is detected. As illustrated in FIG. 8, if applying a conventional repairing technique to the TFT array substrate, the malfunctioning TFT 13 of the point defect pixel 16 is cut off from the connection 8 at a cutting spot 15, and then a metal connection 14 is formed between the pixel electrode 12 of the point defect pixel 16 and the pixel electrode 12' of an adjacent normal pixel 17a by laser CVD. A voltage supplied from the normally operating TFT 13a of the adjacent pixel 17a is supplied to the pixel electrode 12 of the point defect pixel 16 through the pixel electrode 12' of the adjacent pixel 17a and the metal connection 14. After the repair, two pixels 17a and 16 are displayed as a single pixel 18.

With the conventional repairing technique, the adjacent normal pixel 17a has to guarantee the electric potential of the point defect pixel 16. Accordingly, the driving voltage has to be increased in advance for driving two pixels.

Furthermore, if the boundary or the outline of an image extends across the point defect pixel 16 and the adjacent normal pixel 17a that shows different tone or gradation levels, then one of the pixels 16 and 17a is recognized as a dark spot or a bright spot.

In contrast, the repairing technique according to an embodiment of the invention can prevent a dark spot or a bright spot from appearing in the displayed image.

When the point defect pixel 16 due to malfunction of the TFT 13 is detected, the malfunctioning TFT 13 is cut off from the connection 8 at a first cutting point 15. The process is the same as the conventional technique so far.

Then, the pixel electrode 12 of the point defect pixel 16 is divided into two, namely, a first pixel electrode area 12a and a second pixel electrode area 12b, by laser cutting at cutting points 19a and/or 19b. The cutting points 19a and 19b are located along the domain boundary of liquid crystal orientation. In the example shown by FIG. 9, the pixel electrode 12 is cut at the portion where the shape the pixel electrode 12 changes corresponding to the shape of the middle electrode 9. By cutting the pixel electrode 12 at this position, influence on permeability drop after the repair is reduced to the minimum.

Then, the first pixel electrode area 12a is coupled to the pixel electrode 12 of the normal pixel 17a, which is located adjacent to the point defect pixel 16 on one side, by a metal connection 14a. Similarly, the pixel electrode area 12b is coupled to the pixel electrode 12 of the other normal pixel 17b adjacent to the point defect pixel 16 on the other side, by a metal connection 14b. In this manner, the two adjacent normal pixels 17a and 17b now equally undertake additional quantities of electric potential and auxiliary capacitance required for the point defect pixel 16.

The metal connections 14a and 14b are formed by metal film formation, such as laser CVD. The divided pixel electrodes 12a and 12b of the point defect pixel 16 can have the same electric potential as the pixel electrodes 12 of the adjacent pixels 17a and 17b through the metal connections 14a and 14b, respectively.

After the repair, the normal pixel 17a and a half of the point defect pixel 16 (i.e., the pixel electrode area 12a) form a new pixel or a repaired pixel 18a. Similarly, the normal pixel 17b and the other half of the point defect pixel 16 (i.e., the pixel electrode area 12b) form a new pixel or a repaired pixel 18b. The normal pixels 17a and 17b do not have to undertake providing double electric potential and auxiliary capacitance for the adjacent point defect pixel. Each of the two adjacent normal pixels 17a and 17b undertakes only about a 50% greater burden. In other words, even if the driving voltage is not set sufficiently high in anticipation of necessity for repair, a voltage drop and decrease of auxiliary capacitance can be reduced to about only one third (⅓) in the new pixels 18a and 18b after the repair.

As long as the boundary or the outline of an image is not located between the repaired new pixels, no dark spot or bright spot appears in the displayed image, and substantially no image degradation is recognized because the electric potential of the point defect pixel becomes equal to that of the adjacent normal pixels.

Even if the boundary or the outline of the image extends between the repaired new pixels, recognizable image degradation is as small as one third of the normal pixel. Such image degradation is far less conspicuous as compared with the dark spot or the bright spot appearing on the pattern boundary with the convention repair method. In this manner, the displayed image quality is improved.

The above-described repair technique is applicable not only to liquid crystal displays of a vertical alignment (VA) type, but also to a TFT array substrate of IPS (in-plane switching) liquid crystal displays.

Figure 10:
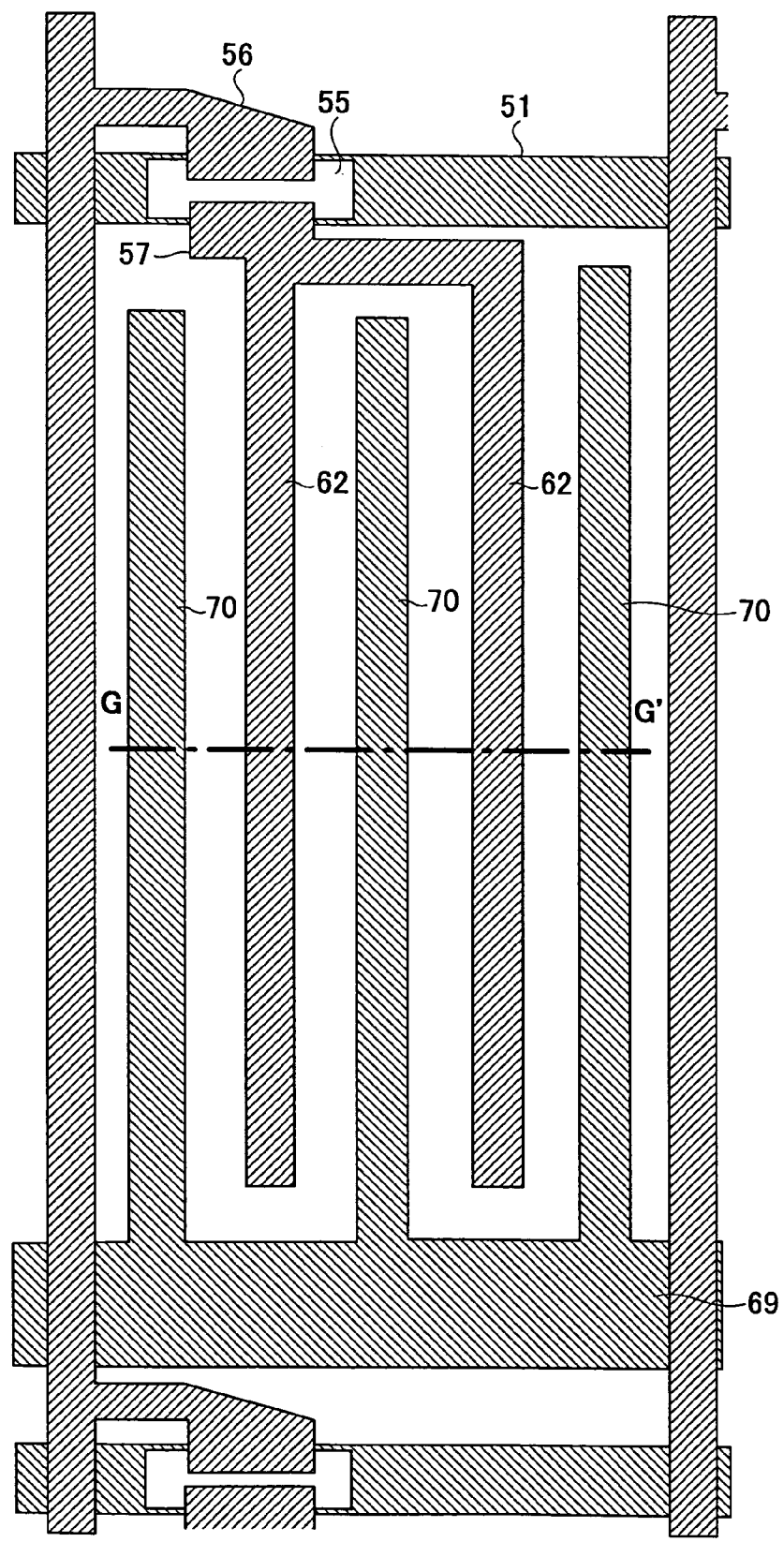
FIG. 10 is a plan view of a pixel area of an in-plane switching (IPS) TFT array substrate for explaining application to an IPS TFT liquid crystal display.
Figure 11:
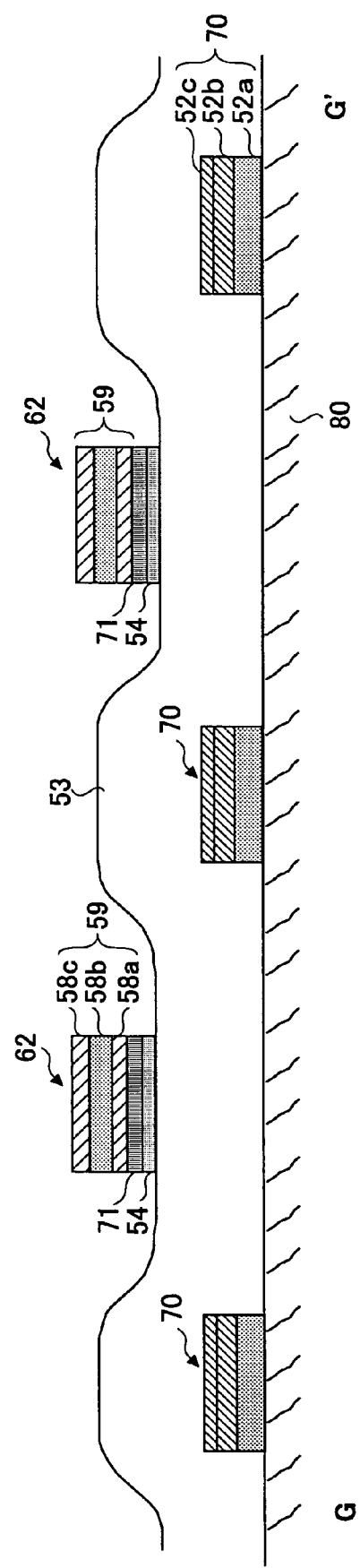
FIG. 11 is a cross-sectional view taken along the G–G' line shown in FIG. 10.
Figure 12:
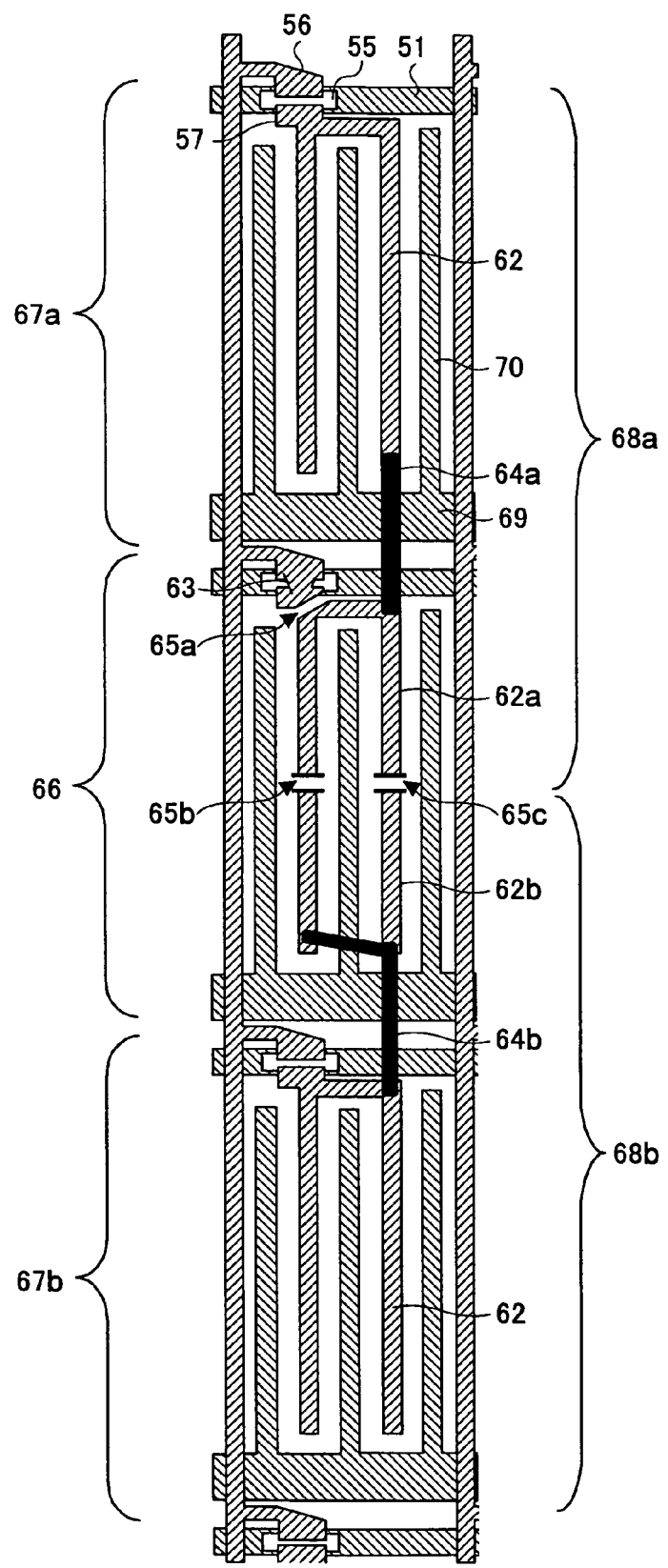
FIG. 12 shows a portion of the pixel array in which a point defect pixel has been repaired using the repair method according to an embodiment of the invention.

FIG. 10 through FIG. 12 illustrate application of the repair method of the present invention to an IPS liquid crystal display according to still another embodiment of the invention. FIG. 10 is a plan view of a pixel area of a TFT array substrate for an IPS LCD, FIG. 11 is a cross-sectional view taken across the G–G' line of FIG. 10, and FIG. 12 shows a part of the TFT array substrate after repair.

Explanation is made of a process for fabricating the TFT array substrate for an IPS LCD with reference to FIG. 10 and FIG. 11, although detailed steps are not illustrated by drawings.

(1) First, the first conductive film is formed over the substrate 80. The first conductive film is delineated into a predetermined pattern using a resist mask to form a gate electrode 51, a common wire 69, and a common electrode 70 extending from the common wire 69. As in the embodiment shown in FIG. 5 and FIG. 6, the first conductive film consists of three layers of an Al layer 52a, a MoN layer 52b, and a Mo layer 52c (see FIG. 11); however, the invention is not limited to this example. After these layers are successively deposited by, for example, sputtering, a resist is formed over the top layer (i.e., the Mo layer) 52c, and the first conductive film with the three-layered structure is patterned by photolithography and etching processes.

(2) Then, a gate insulating layer 53, a semiconductor layer 54, and an etching stopper layer 55 are successively formed over the substrate 80, and the etching stopper layer 55 is patterned such that an island remains on the channel region of the semiconductor layer 54.

(3) Then, an n+ type semiconductor layer 71 and the second conductive film 59 are formed over the substrate 80. The second conductive film 59 consists of a Ti layer 58a, an Al layer 58b and anther Ti layer 58c in the example shown in FIG. 11. However, the second conductive film is not limited to this example, and other suitable structures may be employed. The second conductive film 59, the n+ type semiconductor layer 71, and the semiconductor layer 54 that are formed in the previous step are patterned so as to form a source electrode 57, a drain electrode 56, and a pixel electrode 62.

FIG. 12 is a diagram for explaining the method for repairing the TFT array substrate fabricated for an IPS LCD through the above-described process.

When a point defect pixel 66 due to malfunction of a TFT 63 is detected, the malfunctioning TFT 63 of the point defect pixel 66 is cut off from the pixel electrode 62 at a cutting spot 65a. Furthermore, the pixel electrode 62 of the point defect pixel 66 is divided into two areas 62a and 62b by laser cutting. If the pixel electrode is shaped into a fork, as illustrated in FIG. 10 and FIG. 12, the pixel electrode 62 is cut at cutting spots 65b and 65c. Since the cutting spots 65b and 65c are located along the domain boundary of orientation of liquid crystal, influence on decrease of permeability after repair can be made the minimum.

The pixel electrode area 62a is coupled to the pixel electrode 62 of an adjacent normal pixel 67a by a metal connection 64a for electrical connection. The other pixel electrode area 62b is coupled to the pixel electrode 62 of another adjacent normal pixel 67b by a metal connection 64b for electrical connection. By dividing the pixel electrode of the point defect pixel 66 into two areas 62a and 62b, and by connecting each of them to the pixel electrode of one of the adjacent normal pixels, the electric potential and the auxiliary capacitance of the point defect pixel can be shared by the two adjacent normal pixels fifty-fifty.

The metal connections 64a and 64b are formed by, for example, metal film formation, such as laser CVD. The divided pixel electrodes 62a and 62b of the point defect pixel 66 can have the same electric potential as the pixel electrodes 62 of the adjacent pixels 67a and 67b through the metal connections 64a and 64b, respectively.

In either case of applying the repair method of the present invention to the TFT array substrate of a vertical alignment (VA) liquid crystal display shown in FIG. 9, or to the TFT array substrate of an IPS liquid crystal display s shown in FIG. 12, it is preferred that the pixels connected by the metal connection for repairing a point defect pixel be allocated to the same color if three colors of red (R), green (G), and blue (B) are displayed using color filters. Accordingly, although not shown in a drawing, it is preferable for the pixel array of an IPS LCD to have a configuration shown in FIG. 7, in which the pixels allocated to the same color are aligned in the same column extending in the repair direction.

In the embodiment, an example of applying the repair method to a vertical alignment (VA) liquid crystal display is explained using the auxiliary capacitor structure shown in FIG. 3 and FIG. 4. However, the repair method is applicable to the TFT array substrate with the auxiliary capacitor structure shown in FIG. 5.

In FIG. 3 through FIG. 6 and FIG. 10, explanations are made based on the example of an etching stopper type TFT array substrate. However, the auxiliary capacitor structure and the repair method of the present invention are equally applicable to a channel etching type TFT array substrate.

As described above, the TFT array substrate according to the present invention has an auxiliary capacitor structure that can realize an increased aperture ratio and reliability in inspection.

In addition, in the repair method according to the present invention, degradation of the displayed image quality after repair can be prevented efficiently, without increasing power consumption.

The present patent application is based on Japanese Priority Applications Nos. 2003-097104 and 2004-066096 filed Mar. 31, 2003 and Mar. 9, 2004, respectively, the entire contents of which are hereby incorporated by reference.

What is claimed is:

1. A thin film transistor array substrate defined by a plurality of pixel areas, comprising:
    an insulating substrate;
    a thin film transistor arranged in each of the pixel areas on the insulating substrate;
    an auxiliary capacitor having an auxiliary capacitor electrode arranged in the pixel area and an opposite electrode facing the auxiliary capacitor electrode via an insulating layer, the opposite electrode being located in the same layer as a source electrode and a drain electrode of the thin film transistor; and
    a pixel electrode formed in the pixel area, wherein the opposite electrode is divided into two or more sections in each of the pixel areas, and each of the sections is electrically connected to the pixel electrode via a contact hole.

2. The thin film transistor array substrate according to claim 1, wherein one of the divided sections of the opposite electrode is connected to the source electrode of the thin film transistor via a connection located in the same layer as the opposite electrode and the source electrode.

3. The thin film transistor array substrate according to claim 1, wherein the pixel electrode has a shape defining orientation of liquid crystal, and the electrical connection extends along a boundary between domains with different orientations of the liquid crystal.

4. The thin film transistor array substrate according to claim 2, wherein the source electrode, the connection, and said one of the divided sections of the opposite electrode are integrally formed of the same material.

5. The thin film transistor array substrate according to claim 3, wherein the pixel electrode has a shape with branches extending to the left and right, and the electrical connection extends along a center line of the pixel electrode.

6. A thin film transistor array substrate comprising:

an insulating substrate;

a thin film transistor arranged in a part of a pixel area on the insulating substrate;

an auxiliary capacitor having an auxiliary capacitor electrode arranged in the pixel area and an opposite electrode facing the auxiliary capacitor electrode via an insulating layer, the opposite electrode being located in the same layer as source and drain electrodes of the thin film transistor;

a connection located in the same layer as the source electrode and the opposite electrode and extending between the source electrode and the opposite electrode; and a pixel electrode formed in the pixel area, wherein the opposite electrode is electrically connected to the pixel electrode via a contact hole.

* * * * *